US008035985B2

(12) United States Patent
Nemoz et al.

(10) Patent No.: US 8,035,985 B2
(45) Date of Patent: Oct. 11, 2011

(54) AVIONICS RACK ARRANGEMENT (75) Inventors: Gérard Nemoz, Maisons Alfort (FR);
Philippe Bieth, Saclay (FR);
Christophe Tuzi, Guyancourt (FR)

(73) Assignee: Thales (FR)

( * ) Notice: Subject to any disclaimer, the term of this patent is extended or adjusted under 35 U.S.C. 154(b) by 367 days.

(21) Appl. No.: 12/365,433

(22) Filed: Feb. 4, 2009

(65) Prior Publication Data
US 2009/0195135 A1 Aug. 6, 2009

(30) Foreign Application Priority Data

Feb. 5, 2008 (FR) .................................. 08 00584

(51) Int. Cl.
*H05K 7/14* (2006.01)
*H05K 7/18* (2006.01)
(52) U.S. Cl. ...................................................... 361/797
(58) Field of Classification Search .................. 361/686, 361/731, 756, 788; 312/408, 223.2
See application file for complete search history.

(56) References Cited

U.S. PATENT DOCUMENTS

| 2,938,686 | A | * | 5/1960 | Lohstreter et al. ......... 244/118.1 |
| 5,949,656 | A | | 9/1999 | Pinault |
| 6,529,374 | B2 | * | 3/2003 | Yamashita et al. ....... 361/679.33 |
| 6,583,982 | B2 | * | 6/2003 | Mancini et al. .......... 361/679.03 |
| 6,778,381 | B1 | * | 8/2004 | Bolognia et al. ......... 361/679.07 |
| 7,145,770 | B1 | * | 12/2006 | Zimlin et al. ............ 361/679.33 |
| 7,167,359 | B2 | * | 1/2007 | Wendel et al. ........... 361/679.36 |
| 7,227,744 | B2 | * | 6/2007 | Kitaoka ................... 361/679.31 |
| 7,473,931 | B1 | * | 1/2009 | Beseth et al. .................... 257/81 |
| 2003/0016513 | A1 | * | 1/2003 | McCall et al. ................ 361/785 |
| 2005/0276023 | A1 | * | 12/2005 | Zansky et al. ................ 361/731 |
| 2006/0274516 | A1 | * | 12/2006 | Ruque ........................... 361/796 |
| 2007/0081315 | A1 | * | 4/2007 | Mondor et al. ............... 361/788 |

FOREIGN PATENT DOCUMENTS

| EP | 1729556 | 12/2006 |
| FR | 2783392 | 3/2000 |
| FR | 2822130 | 9/2002 |
| WO | WO 01/80574 | 10/2001 |

\* cited by examiner

*Primary Examiner* — Lisa Lea Edmonds
*Assistant Examiner* — Xanthia C Cunningham
(74) *Attorney, Agent, or Firm* — Lowe Hauptman Ham & Berner, LLP

(57) ABSTRACT

The present invention relates to an electronic equipment rack arrangement principle. In order to allow for the maximum use of COTS (component off the shelf) modules, or, at least, maximum use of "standardized" modules, primarily in relation to the electronic functions of said rack, the electronic equipment rack according to the invention offers a configuration in which the function modules (3) and the interface modules (8) are juxtaposed, preferably vertically, and the electronic functions handled by the function modules (3) are decoupled from the interface functions handled by the interface modules (8). Such a rack also allows for all the maintenance operations to be done through the front panel (F) of said rack, all of its component modules being made accessible from this side.

26 Claims, 7 Drawing Sheets

AVIONICS RACK ARRANGEMENT

RELATED APPLICATIONS

The present application is based on, and claims priority from, French Application Number 0800584, filed Feb. 5, 2008, the disclosure of which is hereby incorporated by reference herein in its entirety.

FIELD OF THE INVENTION

The present invention relates to an electronic equipment rack arrangement principle, and more particularly an avionics rack arrangement principle. The aim of this arrangement is notably to allow for the maximum use of COTS (component off the shelf) modules or, at least, a maximum of "standardized" modules, if possible independent of the type of aircraft, primarily with regard to the electronic functions of said avionics rack. It also enables all the maintenance operations performed on a rack arranged according to the invention to be able to be done via the front panel of said rack, all of its component modules being made accessible from this side.

DISCUSSION OF THE BACKGROUND

Currently, there are numerous possible configurations for avionics racks, or electronic equipment racks in general, of which three main types are usually encountered.

In simple terms, an electronic equipment rack is made up of a mechanical structure comprising a motherboard, electronic equipment handling a set of functions and combined under the designation of function modules, and interface elements allowing for the link with an environment, for example the rest of the aircraft in the case of an avionics rack. Such electronic equipment generally comprises boards or "single replaceable units" (SRU). An electronic equipment rack also comprises internal connectors enabling the motherboard, the electronic equipment and the interface modules to be interconnected, and external connectors enabling the link with the environment of said rack. There is generally a side of the rack that is easily accessible; this side is called the front panel of the rack. From this side, it is usually possible to access the function modules and work almost directly on the electronic equipment or SRUs. The opposite side, generally difficult to access, is called the rear panel of the rack.

Whatever the chosen configuration in the current state of the art, major drawbacks emerge, notably making the maintenance of these racks difficult. There are various such defects generally encountered:

- need to introduce interface elements within the function modules, and therefore the electronic equipment: this leads in fact to the at least partial loss of the possibility of using COTS-electronic equipment because, notably in the case of an avionics rack, the interface modules are specific to each aircraft,
- need to disconnect the rack from its environment to access the electronic equipment, despite the fact that the maintenance operations performed thereon are generally frequent,
- external connectors situated on the rear panel, and therefore generally difficult to access,
- need to dismantle the complete rack to access the interface modules, making a maintenance operation of this type lengthy and complicated,
- great depth of the rack (distance between the front panel and the rear panel), corresponding to a topology that is ill suited in particular to areas along the sides of the aircraft.

Defects in the non-exhaustive list above make it necessary to search for an optimum configuration for the electronic equipment racks: such is the subject of the present patent application.

SUMMARY OF THE INVENTION

To this end, the subject of the invention is an electronic equipment rack, designed to be on board a craft such as an aircraft, and comprising:

- a mechanical structure,
- a motherboard having first internal connectors and second internal connectors,
- at least one function module handling a set of functions via electronic equipment and having internal connectors of the function module enabling interconnection with the first internal connectors of the motherboard,
- at least one interface module designed to provide an interfacing function between said function module and the rack environment, the interface module being linked to external connectors and having internal interface connectors enabling interconnection with the second internal connectors of the motherboard, said electronic equipment rack also having a front panel corresponding to a side through which the electronic equipment of the function module can be accessed and, opposite, a rear panel. According to the invention, the mechanical structure of said electronic equipment rack comprises a first and a second cabinet, the first cabinet containing the electronic equipment that constitutes the function module, and the second cabinet containing the interface module, and in that the function module and the interface module are juxtaposed in a direction orthogonal to the normal to the front panel, and in that the interface module can also be accessed through the front panel of the rack.

In a preferred embodiment of the invention, the function module and the interface module are stacked.

Advantageously, the first cabinet can comprise integrated cooling means, notably for cooling the electronic equipment.

Advantageously, the second cabinet is shorter than the first cabinet in a direction orthogonal to the front panel of the rack.

Advantageously, the interface module is sufficiently shorter than the function module for a free space contiguous to the interface module to be available between the front panel of the rack and said interface module.

Advantageously, the motherboard is located on the side of the rear panel of the rack, the function and interface modules being connected to it, and in that the external connectors linked to the interface module are located on the side of the front panel of the electronic equipment rack.

An electronic equipment rack according to the invention comprises:

- a processing area, where the internal connectors of the function module and the first internal connectors of the motherboard are interconnected,
- an interface area, where the internal interface connectors and the second internal connectors of the motherboard are interconnected, and the internal interface connectors advantageously occupy only a fraction of the surface area of the interface module facing the motherboard, which provides for a wide free area between said processing and interface areas.

Advantageously, the function module comprises "off-the-shelf" electronic equipment (otherwise referred to as COTS, standing for "components off the shelf").

Advantageously, the function module and the interface module have different pitches.

Advantageously, all or some of the external connectors linked to the interface module can meet one of the following specifications: ARINC 600, ARINC 404 A, MIL 83 527, EN4640, EN4165.

Advantageously, all or some of the external connectors linked to the interface module can be fibre optic connectors.

Advantageously, the electronic equipment rack comprises from one to several interface modules linked to one or more function modules.

Advantageously, the interface module comprises an optical star-type element enabling the distribution of optical signals, notably in the environment of the electronic equipment rack.

Advantageously, said optical star-type element may be passive.

Advantageously, an avionics rack on board an aircraft, can be made up of at least one electronic equipment rack according to the invention.

Advantageously, an avionics rack can comprise an interface module including a filter-type protection function, suited to said aircraft.

Advantageously, an avionics rack can comprise an interface module including a lightning-protection function, suited to said aircraft.

Advantageously, an avionics rack can comprise protection and insulation functions between the "aircraft wiring" and the function module.

Advantageously, the interface module comprises transformer- or fuse-type elements handling said protection and insulation functions between the "aircraft wiring" and the function module.

Still other objects and advantages of the present invention will become readily apparent to those skilled in the art from the following detailed description, wherein the preferred embodiments of the invention are shown and described, simply by way of illustration of the best mode contemplated of carrying out the invention. As will be realized, the invention is capable of other and different embodiments, and its several details are capable of modifications in various obvious aspects, all without departing from the invention. Accordingly, the drawings and description thereof are to be regarded as illustrative in nature, and not as restrictive.

BRIEF DESCRIPTION OF THE DRAWINGS

The present invention is illustrated by way of example, and not by limitation, in the figures of the accompanying drawings, wherein elements having the same reference numeral designations represent like elements throughout and wherein.

DETAILED DESCRIPTION OF THE INVENTION

Figure 1:
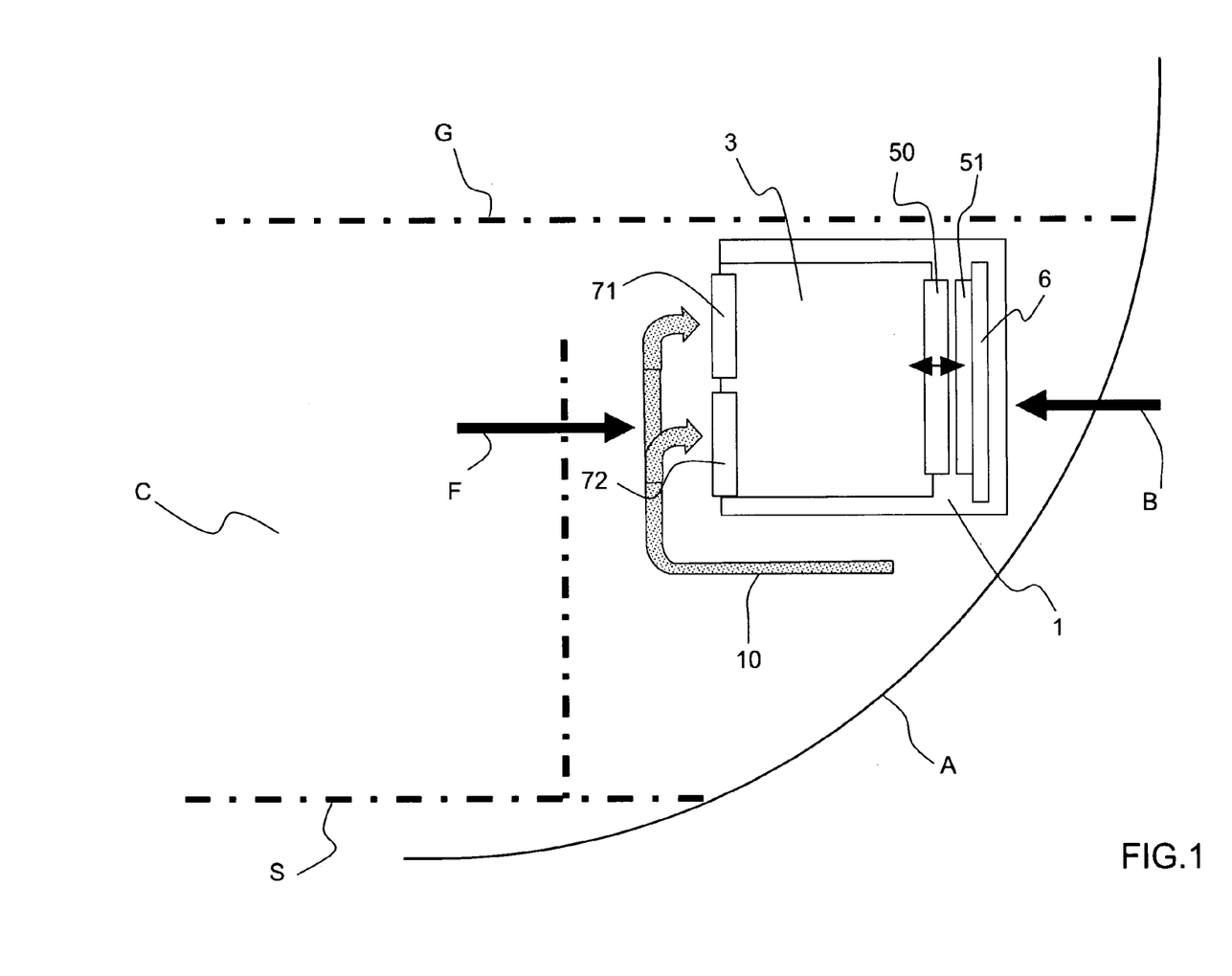
FIG. 1: the diagram of a first possible electronic equipment rack configuration according to the state of the art.

FIG. 1 shows a diagram of a partial section of an aircraft comprising an electronic equipment rack. The aircraft comprises a wall A, a cargo area C and, between the two, an area in which avionics racks can be installed. The passenger deck is represented by the identifier G, and the floor of the cargo area by the identifier S.

The arrow F indicates the front panel of the rack whereas the arrow B indicates the rear panel.

The rack comprises a mechanical structure 1 that is often called "back", a motherboard 6, function modules 3, consisting of different SRUs or electronic equipment. The internal connectors 50, on the side of the function modules 3, and 51, on the side of the motherboard 6, enable the various electronic equipment items of the function modules 3 to be inter-connected, via the motherboard 6, and the wiring 10, connected to the external connectors 71 and 72 and providing the link with the rest of the aircraft.

In such a configuration, the interface functions between the electronic equipment and the rest of the aeroplane are not independent of the function modules 3. Now, passive interface elements, such as lightning protections or filters are generally necessary and specific to each aircraft. The introduction of these interface functions within the electronic functions of the function modules 3 makes it almost impossible to use electronic equipment of COTS type or "standardized" electronic equipment, that is, equipment that is compatible with different aircraft or widely distributed.

Furthermore, the topology associated with this configuration means there is a need to disconnect the "aircraft wiring" 10 from the connectors 71, 72 to be able to access the function modules 3 in the context of a maintenance operation on the electronic equipment. Such maintenance operations, which are frequent, are therefore slowed down.

Figure 2:
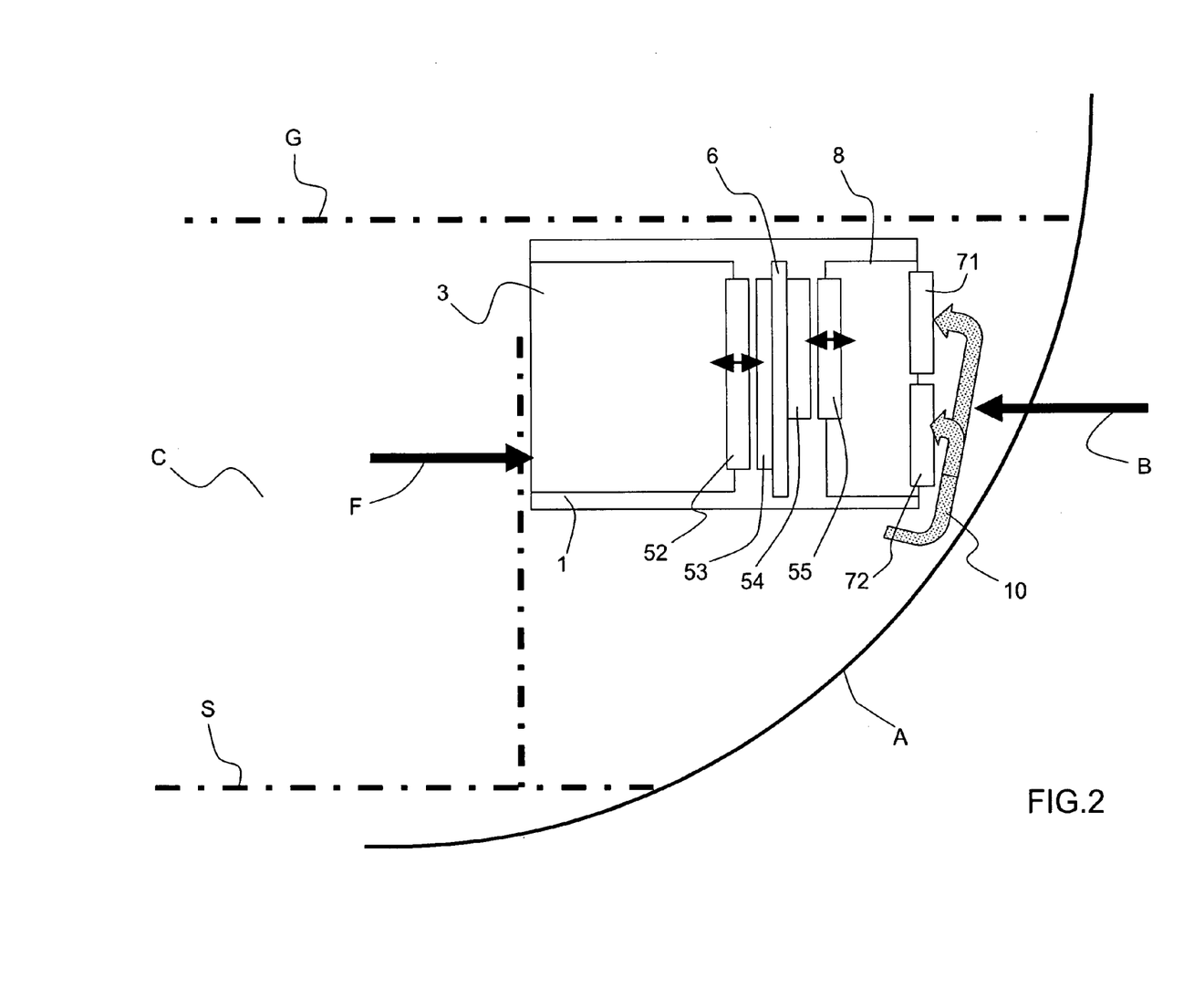
FIG. 2: the diagram of a second possible electronic equipment rack configuration according to the state of the art.

FIG. 2 shows a second possible configuration of an avionics rack according to the state of the art. In addition to the elements already shown in FIG. 1, the rack of FIG. 2 comprises interface modules 8 for which the interconnection with the motherboard 6 and the function modules 3 is provided by means of second internal connectors 54, 55. It thus becomes possible to use a maximum of COTS-type or "standardized" electronic equipment to construct the function modules 3. In effect, the interface functions, comprising the specific elements such as the lightning protections, are handled by the interface modules 8.

On the other hand, in this type of configuration, the interface modules 8 are located on the side of the rear panel B of the rack. Similarly, the external connectors 71, 72 enabling the connection of the "aircraft wiring" 10 are on the side of the rear panel B of the rack. Thus, the "aircraft wiring" 10, situated on the side of the wall A, becomes difficult to access. This also complicates any maintenance operation on the interface modules 8. Despite the fact that this type of maintenance is less frequent than the maintenance on the electronic equipment of the function modules 3, it is still regular.

Furthermore, this configuration increases the depth of the rack because of the addition of the interface modules 8 on the side of the rear panel B. The space needed between the cargo area C and the wall A of the aircraft is therefore increased.

Thus, the drawbacks associated with this configuration are still a major consideration.

Figure 3:
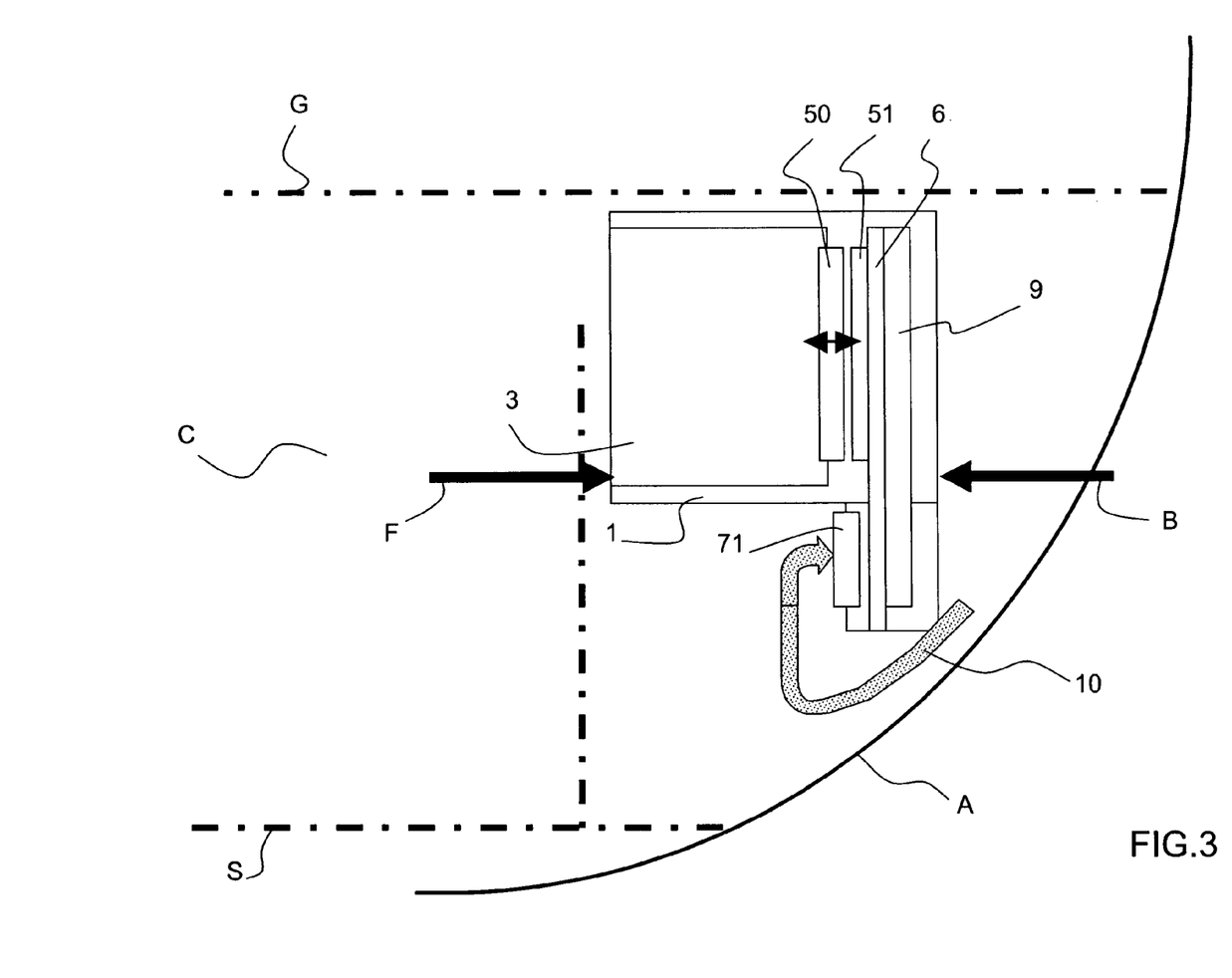
FIG. 3: the diagram of a third possible electronic equipment rack configuration according to the state of the art.

FIG. 3 represents a third example of avionics rack configuration that exists in the current state of the art. According to this configuration, an interface board 9 can be connected to the motherboard 6 on the side of the rear panel B of the rack. This means that, because of the geometry chosen for the motherboard 6 and the interface board 9, it is possible to have external connectors 71 on the side of the front panel F of the rack. The interface board 9, connected to the motherboard 6, is in an intermediate position between the function modules 3 and the aircraft.

While there is a real improvement in the topology compared to the first two configurations, there are still defects. Firstly, according to this configuration, the presence of an interface board 9 is possible but not systematic. It if is omitted, there is the drawback of having to introduce interface functions at the core of the electronic equipment of the function modules 3, making the use of COTS-type or "standardized" electronic equipment improbable.

If present, this interface board 9 increases the depth of the rack, meaning that more space is needed between the cargo area C and the wall 3. Furthermore, a maintenance operation on such an interface board 9, located on the side of the rear panel B of the rack, is complex and costly in time.

To sum up, all of the electronic equipment rack configurations of the current state of the art present major drawbacks, notably in terms of difficulty in carrying out maintenance operations, or footprint.

Figure 4:
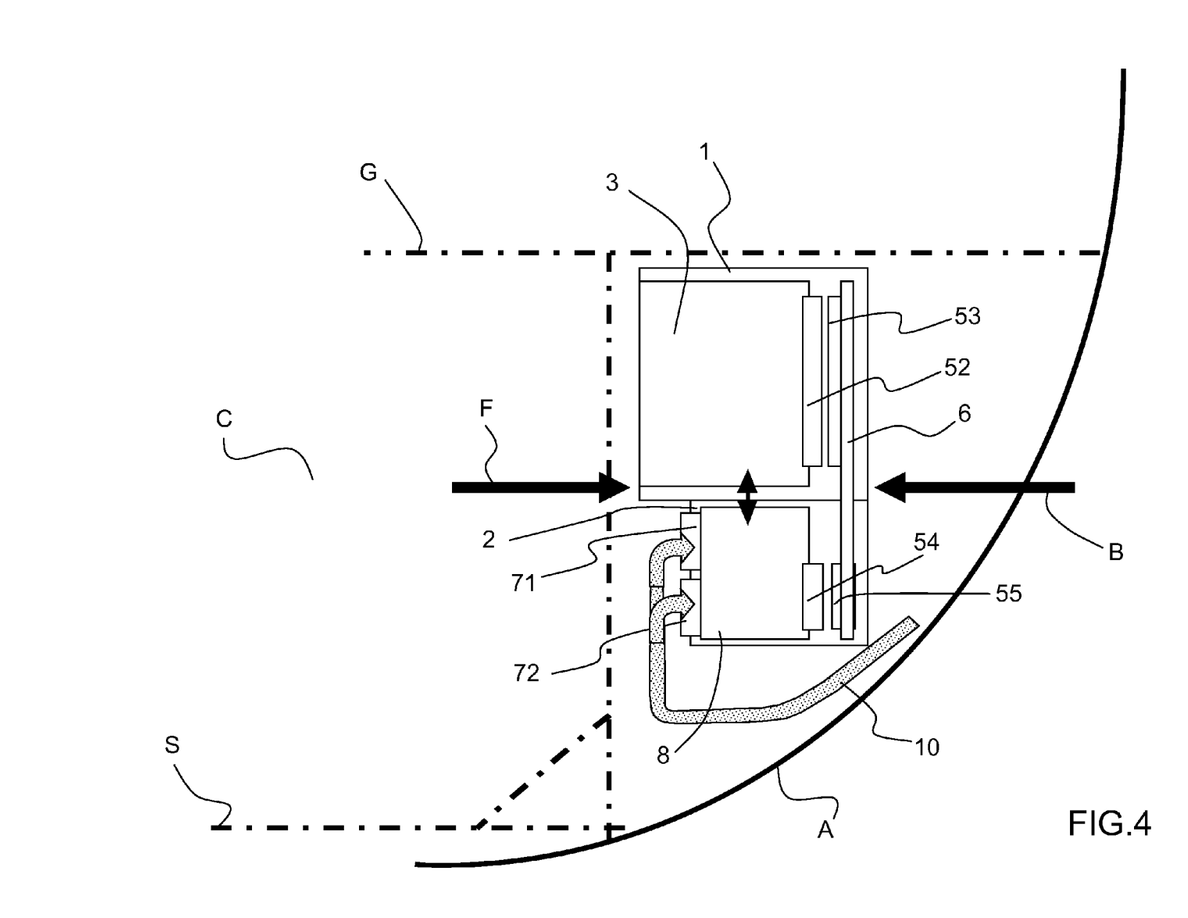
FIG. 4: the diagram of a possible optimized configuration for electronic equipment racks, according to the invention.

Given this context, the invention proposes an enhanced electronic equipment rack configuration. FIG. 4 illustrates one example thereof. This electronic equipment rack presents an original topology, in which the function modules 3 and the interface modules 8 are juxtaposed in a direction orthogonal to the normal to the front panel F of the rack. This topology notably makes it possible to minimize the distance between the front panel F and the rear panel B of the rack. In the chosen example, it is a vertical topology. The interface modules 8 are here located under the function modules 3. It should be noted that it would conversely be possible to have the interface modules 8 above the function modules 3 while retaining the same type of vertical topology. Moreover, in an electronic equipment rack according to the invention, the function modules 3 and the interface modules 8 can be juxtaposed side-by-side.

In FIG. 4, it can be seen that the second internal connectors 54, 55 enable the interface modules 8 and the motherboard 6 to be interconnected whereas the first internal connectors 52, 53 enable the function modules 3 and the motherboard 6 to be interconnected. The motherboard 6, totally passive, supports only the internal connectors 53, 55.

The structure of the rack comprises two "backs" or cabinets 1 and 2. The first cabinet 1 is designed to receive the function modules 3 comprising electronic equipment, for example SRUs. Such electronic equipment can be independent of the type of aircraft for which the avionics rack is intended. They are, moreover, directly accessible via the front panel F of the rack, which facilitates the maintenance operations on the function modules 3. It will also be noted that the first cabinet 1 can comprise cooling elements designed to avoid any unwanted overheating of the electronic equipment. This cooling can be provided by a circulation of coolant or by forced air distribution, for example.

Under the first cabinet 1, there is a second cabinet 2, housing the interface modules 8. Generally, an interface module 8 is shorter and less bulky than a function module 3, because it is less complex. Consequently, the second cabinet 2 is shorter than the first cabinet 1. Since the two cabinets 1, 2 are aligned on the side of the rear panel B of the rack, a space is made available upstream of the second cabinet 2, on the side of the front panel F of the rack. This space enables the "aeroplane wiring" 10, connected to the external connectors 71, 72, not to extend beyond the front panel F of the rack, which shelters it from any mechanical degradations and/or facilitates the fitting of a possible reinforcing plate on the front panel F of the rack.

In the rack configuration proposed here, the pitches and the thicknesses of the function modules 3 can differ from those of the interface modules 8. The interface modules 8 adapt best to the external connectors 71, 72 of the aircraft and can provide for a continuity of the segregation routes of the aircraft as far as the modules.

For their part, the function modules 3 can comprise COTS-type or "standardized" electronic equipment. The interconnection between the function modules 3 and the interface modules 8 is provided by the internal connectors 52, 53, 54, 55.

The maintenance of the interface modules 8 may require the disconnection of the "aircraft wiring" 10, but access to said interface modules 8 is via the front panel F of the rack. Furthermore, it should be noted that the maintenance operations on the interface modules 8 are generally less frequent than on the function modules 3, notably because of the passivity of the interface modules 8 that consequently dissipate no, or little, power.

This vertical organization makes a free area 30 available between the interface area 40 and the processing area 20 within the rack, between the function modules 3, the interface modules 8 and the motherboard 6.

Figure 5A:
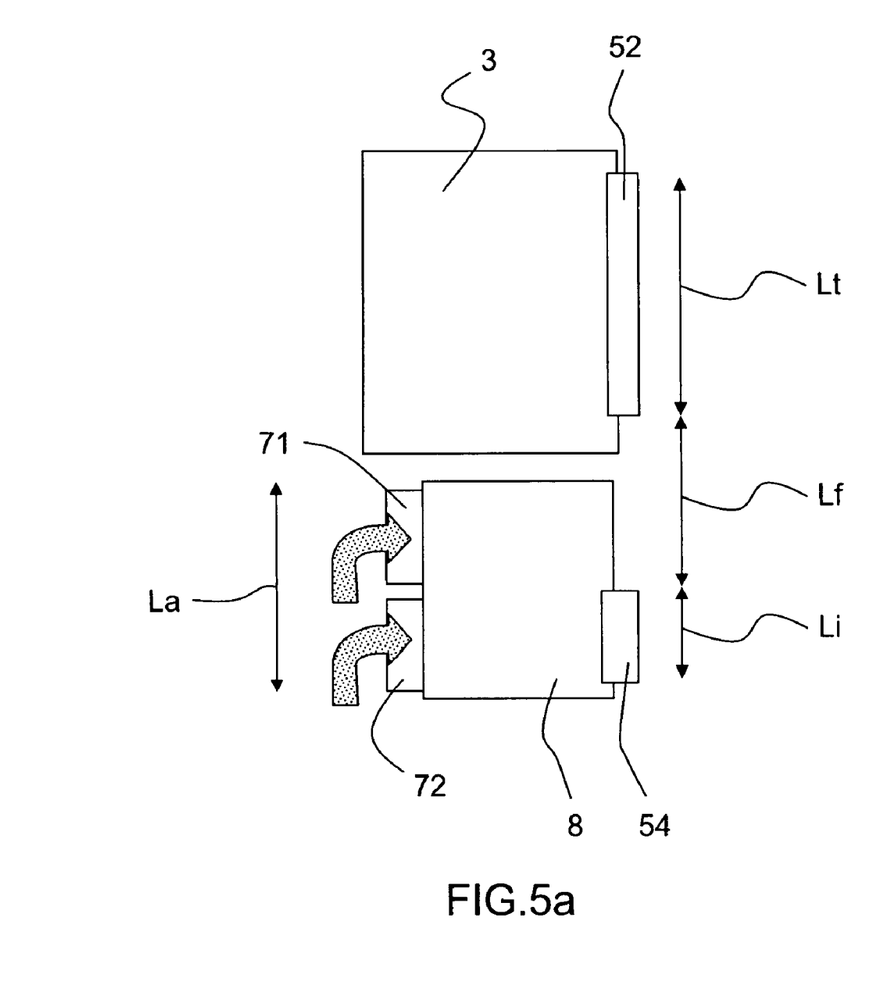
FIG. 5a: the simplified diagram of an electronic equipment rack arranged according to the invention, highlighting a free area at the heart of the rack.
Figure 5B:
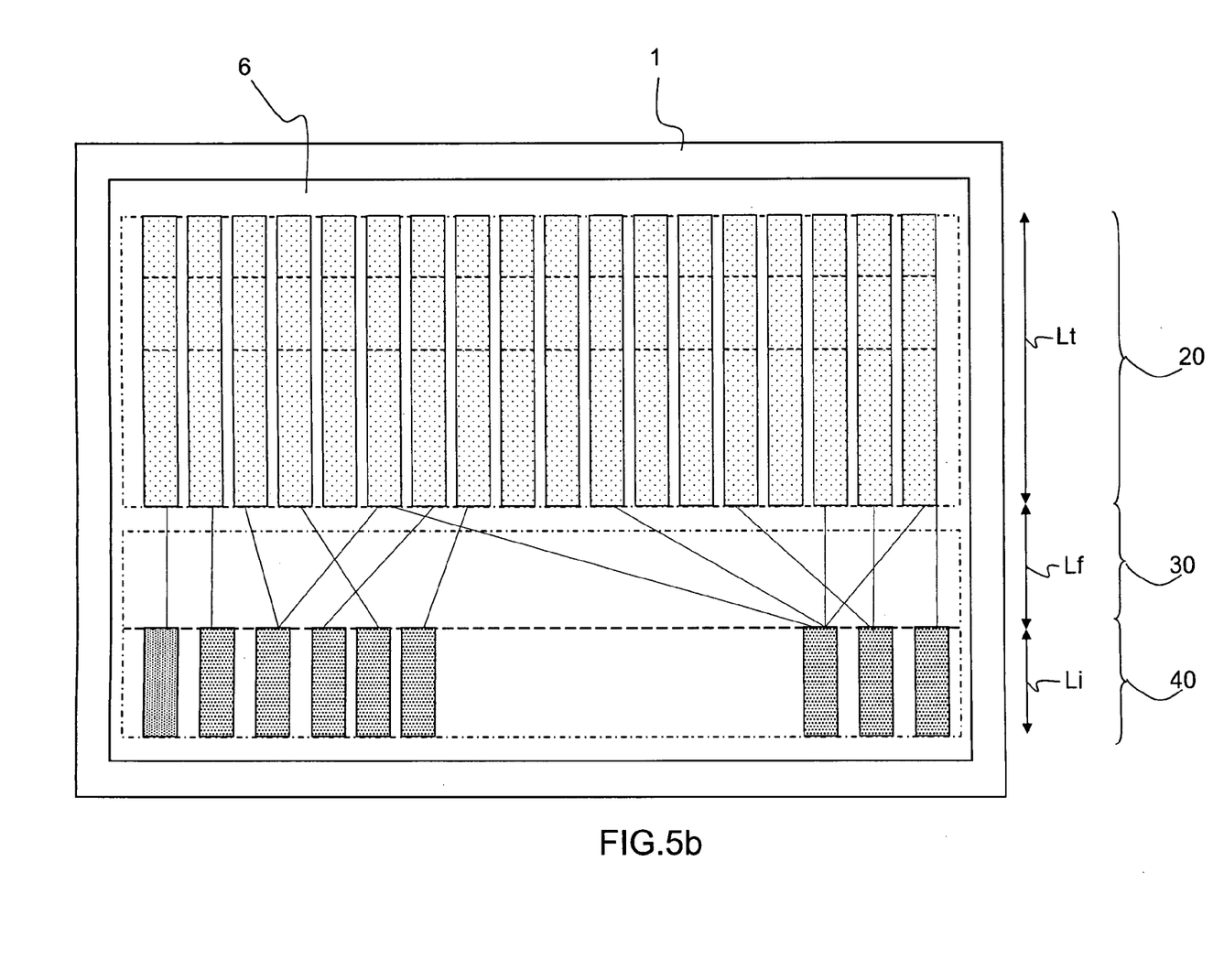
FIG. 5b: the illustration of the possibility of having a wide free area enabling the signals to be sorted and distributed according to the pattern of a motherboard and its internal connectors in an electronic equipment rack configured according to the invention.

This is what FIGS. 5a and 5b show. In practice, as the diagram 5a shows, the length La of the external connectors 71, 72, to which the "aircraft wiring" 10 is connected, is conventionally greater than the length Li of the second internal connectors 54, which allows for connection between the interface modules 8 and the motherboard 6. Consequently, as FIG. 5b shows, a free area 30 of length Lf appears between the processing area 20 of length Lt, corresponding to the area of interconnection between the function modules 3 and the motherboard 6, and the interface area 40 of length Li, corresponding to the area of interconnection between the interface modules 8 and the motherboard 6. As an example, in the case of an avionics rack with external connectors 71, 72, suited to the aircraft, of EN4640 or EN4165 type, and with internal connectors 52, 53, 54, 55 of "ZD" type, the following values are possible:

La is 90 mm, Li is 50 mm approximately ⇒ Lf is approximately 70 mm to 80 mm,

La is 190 mm, Li is 100 mm approximately ⇒ Lf is approximately 120 mm to 130 mm.

Thus, this free space 30 represented in FIG. 5b enables the signals to be sorted and distributed between the interface area 40 at the input/output of the interface modules 8 and the processing area 20, at the input/output of the function modules 3.

Figure 6:
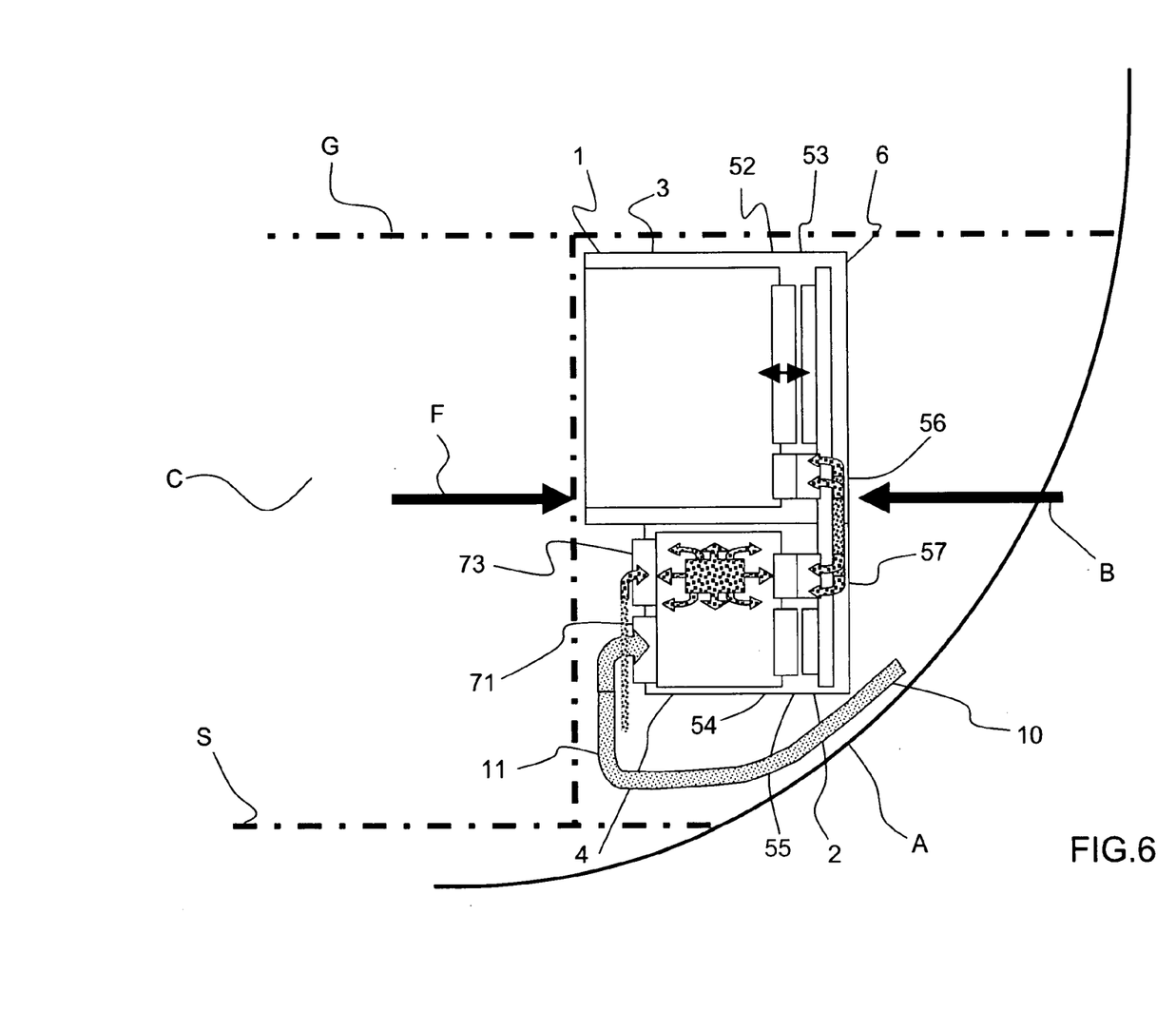
FIG. 6: the diagram of an electronic equipment rack according to the invention, having internal and external optical connectors.

FIG. 6 shows the diagram of a variant of avionics rack arranged according to the invention. In addition to the elements already mentioned, this variant has external optical connectors 73, and the internal optical connectors 57 between the interface modules 8 and the motherboard 6 and the internal optical connectors 56 between the function modules 3 and the motherboard 6. This makes it possible to connect an optical fibre 11 originating from the aircraft containing the rack. In this case, optical bus link cables, bidirectional or otherwise, are incorporated on the motherboard 6.

This optical link enables one or more interface modules 8 to be interconnected with one or more function modules 3 with no limitation other than the capacity of the optical connectors.

Furthermore, in such an electronic equipment rack having optical connectors, interface modules 8 can include "optical stars", preferably passive, but possibly active, enabling optical signals to be redistributed in the environment of the rack.

To sum up, certain advantages provided by the invention can be cited. Firstly, because of its topology and the accessibility of the electronics functions (function modules 3) and interface functions (interface modules 8), and the external connectors 71, 72 on the front panel F, an electronic equipment rack according to the invention makes the following easy:

- the connection-disconnection of the "aircraft wiring" 10 on its external connectors 71, 72, requiring no access at the rear of the rack as a whole,
- the maintenance of the electronic equipment of the function modules 3, directly accessible, without any intervention on the "aircraft wiring" 10,
- the maintenance, significantly less frequently, of the interface modules 8, relatively simple by accessibility after disconnection of the "aircraft wiring" 10.

Generally, the vertical topology is also particularly well suited to the volume available between the wall A and the cargo area C of an aircraft. In practice, as FIGS. 1, 2, 3, 4, 5a and 6 show, this volume is generally narrow, meaning there is a short distance between the front F and rear B panels of the rack, and relatively high, notably allowing the vertical configuration of the rack of the present patent application.

Also, the decoupling between the electronic functions handled by the function modules 3 and the interface functions handled by the interface modules 8 makes it possible to observe the segregation rules as far as the electronics level and, where appropriate, as far as the signals on the optical buses. This decoupling also makes it possible to maximize the use of COTS-type electronic modules, or at least of "standardized" electronic modules, to construct the function modules 3. Furthermore, the function 3 and interface 8 modules can, because they are decoupled, have different pitches, which makes it possible to optimize the adaptability of an electronic equipment rack to any type of equipment or aircraft for which it is intended.

Moreover, the mechanical structure 1, 2 of an electronic equipment rack according to the invention is totally passive: it supports only the connectors and any cooling devices. Consequently, this mechanical structure 1, 2 can become totally standard and be useable on different types of aeroplane, for example. This passivity of the mechanical structure 1, 2 renders the maintenance operations on it almost pointless. Only mechanical breaks require intervention. Another consequence is that it becomes possible to ensure the mechanical strength of the structure 1,2 of the rack in a rigid way, on the wall of an aircraft for example: in practice, it will potentially never be necessary to dismantle said rack. Thanks to that, any cooling devices inserted into the mechanical structure 1, 2 can have their reliability increased, in the absence of frequent dismantling/reassembly of the rack.

It will be readily seen by one of ordinary skill in the art that the present invention fulfils all of the objects set forth above. After reading the foregoing specification, one of ordinary skill in the art will be able to affect various changes, substitutions of equivalents and various other aspects of the invention as broadly disclosed herein. It is therefore intended that the protection granted hereon be limited only by definition contained in the appended claims and equivalents thereof.

The invention claimed is:

1. Electronic equipment rack, designed to be on board a craft comprising:
   - a mechanical structure,
   - a motherboard having first internal connectors and second internal connectors,
   - at least one function module handling a set of functions via electronic equipment and having internal connectors of the function module enabling interconnection with the first internal connectors of the motherboard,
   - at least one interface module designed to provide an interfacing function between said function module and the rack environment, the interface module being linked to external connectors and having internal interface connectors enabling interconnection with the second internal connectors of the motherboard, said electronic equipment rack also having a front panel corresponding to a side through which the electronic equipment of the function module can be accessed and, opposite, a rear panel, wherein the mechanical structure of the electronic equipment rack comprises a first and a second cabinet, the first cabinet containing the electronic equipment that constitutes the function module, and the second cabinet containing the interface module, and in that the function module and the interface module are juxtaposed in a direction orthogonal to the normal to the front panel, and in that the interface module can also be accessed through the front panel of the rack.

2. The electronic equipment rack according to claim 1, wherein the function module and the interface module are stacked.

3. The electronic equipment rack according to claim 2, wherein the first cabinet comprises integrated cooling means, notably for cooling the electronic equipment.

4. The electronic equipment rack according to claim 3, wherein the second cabinet is shorter than the first cabinet in a direction orthogonal to the front panel of the rack.

5. The electronic equipment rack according to claim 4, wherein the interface module is sufficiently shorter than the function module for a free space contiguous to the interface module to be available between the front panel of the rack and said interface module.

6. The electronic equipment rack according to claim 1, wherein the motherboard is located on the side of the rear panel of said rack, the function and interface modules being connected to it, and in that the external connectors linked to the interface module are located on the side of the front panel of the electronic equipment rack.

7. The electronic equipment rack according to claim 5, wherein the motherboard is located on the side of the rear panel of said rack, the function and interface modules being connected to it, and in that the external connectors linked to the interface module are located on the side of the front panel of the electronic equipment rack.

8. The electronic equipment rack according to claim 1, and comprising:
   - a processing area, where the internal connectors of the function module and the first internal connectors of the motherboard are interconnected,
   - an interface area, where the internal interface connectors and the second internal connectors of the motherboard are interconnected, wherein the internal interface connectors occupy only a fraction of the surface area of the interface module facing the motherboard, providing for a wide free area between said processing and interface areas.

9. The electronic equipment rack according to claim 7, and comprising:

a processing area, where the internal connectors of the function module and the first internal connectors of the motherboard are interconnected, an interface area, where the internal interface connectors and the second internal connectors of the motherboard are interconnected, wherein the internal interface connectors occupy only a fraction of the surface area of the interface module facing the motherboard, providing for a wide free area between said processing and interface areas.

10. The electronic equipment rack according to claim 1, wherein the function module comprises "off-the-shelf" electronic equipment, otherwise referred to as COTS, standing for "components off the shelf".

11. The electronic equipment rack according to claim 1, wherein the function module and the interface module have different pitches.

12. The electronic equipment rack according to claim 1, wherein all or some of the external connectors linked to the interface module meet one of the following specifications: ARINC 600, ARINC 404 A, MIL 83 527, EN4640, EN4165.

13. The electronic equipment rack according to claim 1, wherein all or some of the external connectors linked to the interface module are fibre optic connectors.

14. The electronic equipment rack according to claim 1, wherein the electronic equipment rack comprises from one to several interface modules linked to one or more function modules.

15. The electronic equipment rack according to claim 1, wherein the interface module comprises an optical star-type element enabling the distribution of optical signals, notably in the environment of the electronic equipment rack.

16. The electronic equipment rack according to claim 13, wherein said optical star-type element is passive.

17. Avionics rack on board an aircraft, comprising at least one electronic equipment rack according to claim 1.

18. Avionics rack on board an aircraft, comprising at least one electronic equipment rack according to claim 5.

19. Avionics rack on board an aircraft, comprising at least one electronic equipment rack according to claim 7.

20. Avionics rack on board an aircraft, comprising at least one electronic equipment rack according to claim 9.

21. Avionics rack on board an aircraft, comprising at least one electronic equipment rack according to claim 10.

22. Avionics rack on board an aircraft, comprising at least one electronic equipment rack according to claim 12.

23. Avionics rack according to claim 17, wherein the interface module comprises a filter-type protection function, suited to said aircraft.

24. Avionics rack according to claim 17, wherein the interface module comprises a lightning-protection function, suited to said aircraft.

25. Avionics rack according to claim 17, wherein the interface module comprises protection and insulation functions between the "aircraft wiring" and the function module.

26. Avionics rack according to claim 17, wherein the interface module comprises transformer or fuse-type elements handling said protection and insulation functions between the aircraft wiring and the function module.

* * * * *